(12) United States Patent
Chao et al.

(10) Patent No.: US 7,714,503 B2
(45) Date of Patent: May 11, 2010

(54) ORGANIC ELECTROLUMINESCENCE PANEL AND METHOD FOR FABRICATING THE SAME

(75) Inventors: Ching-Ian Chao, Hsinchu County (TW); Che-Jen Chen, Kaohsiung (TW)

(73) Assignee: Au Optronics Corp., Hsin-Chu (TW)

( * ) Notice: Subject to any disclaimer, the term of this patent is extended or adjusted under 35 U.S.C. 154(b) by 424 days.

(21) Appl. No.: 11/608,920

(22) Filed: Dec. 11, 2006

(65) Prior Publication Data

US 2007/0278933 A1   Dec. 6, 2007

(30) Foreign Application Priority Data

May 30, 2006   (TW) ............... 95119266 A

(51) Int. Cl.
   *H01J 1/62*   (2006.01)
(52) U.S. Cl. .................. 313/504; 428/690; 445/24; 445/25
(58) Field of Classification Search ............... 313/504; 445/24–25; 430/321; 118/504; 428/690
   See application file for complete search history.

(56) References Cited

U.S. PATENT DOCUMENTS

| | | | |
|---|---|---|---|
| 5,294,869 A | | 3/1994 | Tang et al. |
| 6,224,448 B1 * | | 5/2001 | Tada et al. ............ 445/24 |
| 6,384,529 B2 | | 5/2002 | Tang et al. |
| 6,517,996 B1 * | | 2/2003 | Chao et al. ............ 430/321 |
| 6,791,258 B2 | | 9/2004 | Haase et al. |
| 2002/0011785 A1 | | 1/2002 | Tang et al. |
| 2003/0082406 A1 * | | 5/2003 | Murase et al. ........... 428/690 |
| 2004/0221806 A1 * | | 11/2004 | Kim ..................... 118/504 |

FOREIGN PATENT DOCUMENTS

| | | |
|---|---|---|
| CN | 1638544 | 7/2005 |
| TW | 451601 | 8/2001 |

* cited by examiner

*Primary Examiner*—Sikha Roy
*Assistant Examiner*—Mary Ellen Bowman
(74) *Attorney, Agent, or Firm*—Thomas, Kayden, Horstemeyer & Risley

(57) ABSTRACT

An organic electroluminescent panel includes several sub-pixels. The sub-pixels include at least one first electrode; at least one shadow wall formed at the periphery of the first electrode; at least one first common layer formed on the first electrode; several emission layers independently formed on the first common layer; at least one second common layer formed on the emission layers; and at least one second electrode formed on the second common layer. During the fabricating process, the first, second, and third color evaporation sources are provided independently for forming the first, second, and third color emission layers on the corresponding region of first electrode. The tilt directions of three color evaporation sources and the evaporation angles between the evaporation source and the substrate surface are determined according to the positions and heights of the shadow walls.

21 Claims, 18 Drawing Sheets

ORGANIC ELECTROLUMINESCENCE PANEL AND METHOD FOR FABRICATING THE SAME

This application claims the benefit of Taiwan Patent Application No. 95119266, filed May 30, 2006, the contents of which are herein incorporated by reference in its entirety.

BACKGROUND OF THE INVENTION

1. Field of the Invention

The present invention relates in general to an organic electroluminescent panel and, more particularly, to a pixel structure of an organic electroluminescent panel and a method for fabricating the same for reducing cost and increasing the panel quality.

2. Description of the Related Art

Compared with other flat panel display technologies, organic electroluminescent panels have many preferred advantages such as self-luminescence, high brightness, wide viewing angle, high contrast, low power consumption, high speed response, widely temperature operating range, high luminescence efficiency, and simple fabrication.

The conventional organic electroluminescent device has a multi-layer structure mainly including an organic emission layer between an anode and a cathode for generating electroluminescence. A hole injection layer and a hole transport layer are formed between the organic emission layer and the anode. An electron transport layer is formed between the organic emission layer and the cathode. Generally, an organic electroluminescent panel is constituted of red light (R), green light (G), and blue light (B) sub-pixels. A pixel includes at least one red light sub-pixel, one green light sub-pixel, and one blue light sub-pixel. Generally, the arrangement of the RGB sub-pixels of the organic electroluminescent panel continues using the arrangement of the RGB sub-pixels of the liquid crystal display panel. The common arrangement of the RGB sub-pixels includes stripe arrangement, mosaic arrangement, and delta arrangement (triangle arrangement), and the stripe arrangement is the most commonly used. Because the RGB sub-pixels for full-color OLED display are usually fabricated by shadow mask evaporation, there are many disadvantages in the fabrication process. The disadvantages include:

1. Higher cost: All kinds of equipments such as mask fabrication, a precise alignment system, a mask chamber, a mask cleaning system, and mask inspection equipment are needed for the fabrication process. These equipments increase the manufacturing cost for even more than one hundred million New Taiwan Dollars.

2. Lower yield: In the mask alignment process due to misalignment of the mask, particle adhesion, or pressing damage decreases the yield of the panel.

3. Lower resolution of the panel: The opening of each mask is usually adaptive to correspond to the evaporation area of one sub-pixel. Thus, the area of the opening of the mask determines the resolution of the organic electroluminescent panel, and the resolution of the conventional full-color panel is limited to the process capability. The resolution of the conventional panel adopting the shadow mask process is approximately between 120 and 150 ppi (pixel per inch) and is usually not more than 180 ppi.

4. Lower production flexibility: Fabricating the shadow mask generally needs about 6 weeks, and only one pattern is allowed to be formed on one shadow mask to prevent non-uniform tension. Thus, the shadow mask fabrication has only limited flexibility.

Many manufacture companies provide mask-free organic electroluminescent panels (for example, U.S. Pat. No. 5,294,869 and U.S. Pat. No. 6,517,996). However, these conventional technologies have some common disadvantages. That is, the original RGB device structure of the organic electroluminescent device needs to be changed to accommodate to the mask-free full-color panels. Additionally, the different emission layers overlap with each other in the fabricated device structure, or emission materials with different-color light are mixed in an emission layer. For example, a blue emission layer overlaps over a red emission layer in U.S. Pat. No. 5,294,869, and a blue emission material is mixed in a red emission layer in U.S. Pat. No. 6,517,996. As a result, mixing light phenomenon may occur in the emission layer or in the device structure.

Therefore, it is very important to fabricate a mask-free organic electroluminescent panel without changing the original fabricating method of the RGB device structure and to fabricate the mask-free organic electroluminescent panel with low cost, high light purity and no light mixture.

SUMMARY OF THE INVENTION

A pixel structure of an organic electroluminescent panel and a method for fabricating the same are provided.

An embodiment of a pixel structure of an organic electroluminescent panel. The pixel structure includes several sub-pixels. The sub-pixels include:

at least one first electrode;

at least one shadow wall formed at the periphery of the first electrode;

at least one first common layer formed on the first electrode;

several emission layers, each emission layer being formed on the first common layer of a corresponding sub-pixel, wherein each emission layer is non-overlapped with each other;

at least one second common layer formed on the emission layers; and at least one second electrode formed on the second common layer.

An embodiment of a method for fabricating an organic electroluminescent panel having a substrate is provided. The method includes:

forming a first electrode on the substrate;

forming several shadow walls on the first electrode;

forming at least a first common layer on the first electrode;

forming several first color emission layers, several second color emission layers and several third color emission layers over the first common layer, comprising:

providing at least one first color evaporation source, at least one second color evaporation source and at least one third color evaporation source, wherein an independent evaporation directions and evaporation angles of the first, the second and the third evaporation sources cooperate with the shadow walls so as to independently form at least one first color emission layer, at least one second color emission layer and at least one third color emission layer respectively formed on the corresponding region of the first electrode with the corresponding color;

forming at least one second common layer covering the first color emission layers, the second color emission layers and the third color emission layers; and forming a second electrode on the second common layer.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

An organic electroluminescent panel and a method for fabricating the same are provided by the present invention. Shadow walls are formed in a pixel structure. Independent evaporation directions and evaporation angles of three color evaporation sources (such as RGB evaporation sources) cooperate with the shadow walls. As a result, three color emission layers (such as RGB emission layers) are formed singly and independently over three color emission regions. Therefore, different colors do not cover each other (including different color emission layers overlapping with each other or single emission layer including two emission materials with different colors).

Figure 1A:
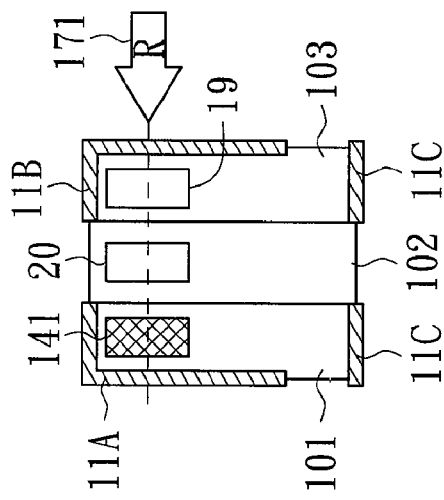
FIGS. 1A~1C illustrate a method of fabricating an organic electroluminescent panel according to a preferred embodiment of the present invention.
Figure 1A:
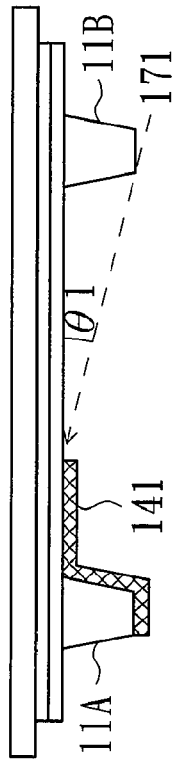
Figure 1B:
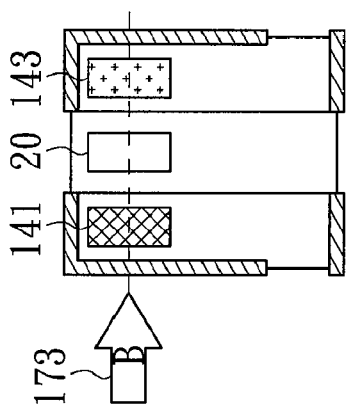
Figure 1B:
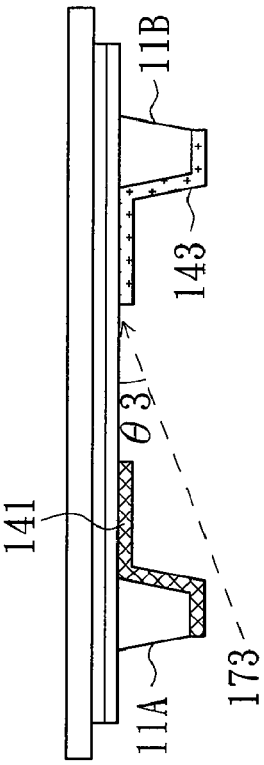
Figure 1C:
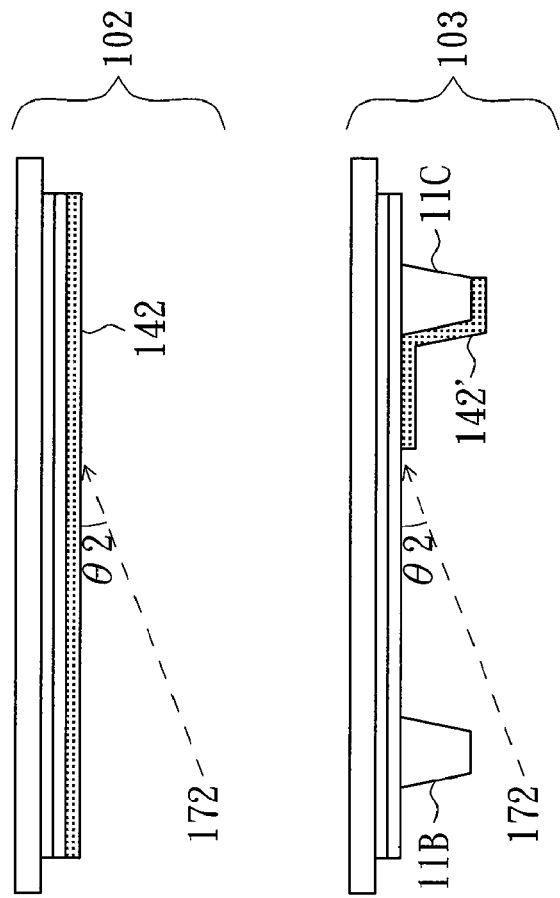
Figure 1C:
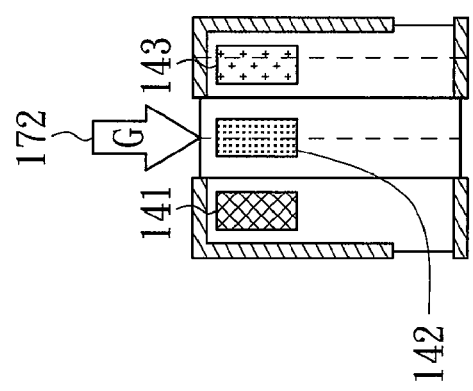
Figure 3:
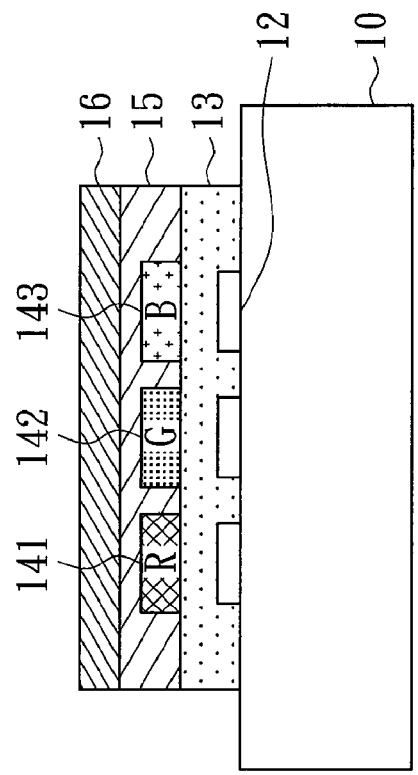
FIG. 3 illustrates a cross-sectional view of the single pixel of the organic electroluminescent panel according to the preferred embodiment of the present invention.
Figure 2:
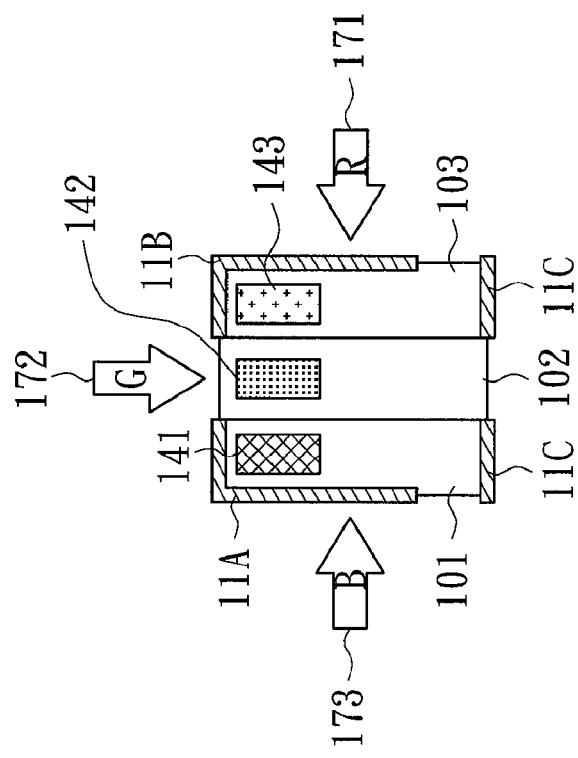
FIG. 2 illustrates a top view of a single pixel structure fabricated according to the method in FIGS. 1A~1C.

FIGS. 1A~1C illustrate a method of fabricating an organic electroluminescent panel according to a preferred embodiment of the present invention. The main point of FIGS. 1A~1C is that RGB emission layers are formed independently by evaporating process. A first electrode, a first common layer, a second common layer and a second electrode are not illustrated in FIGS. 1A~1C. Also, the emission layer for RGB sub-pixels in all the top-view figures only show the areas on the first electrodes in order to simplify. FIG. 2 illustrates a top view of a single pixel structure fabricated according to the method in FIGS. 1A~1C. FIG. 3 illustrates a cross-sectional view of the single pixel of the organic electroluminescent panel according to the preferred embodiment of the present invention.

In the present embodiment of the invention, a pixel is made up of at least three adjacent sub-pixels, but non-limited it, for example, three or more adjacent sub-pixels, including four, five, six, etc. In additional, the color of each sub-pixel is not limited in red, green, blue, may be include other color, for example, white, brown, yellow, Cyan, Magenta, etc. The pixel includes at least a first region (such as a red sub-pixel region 101), at least a second region (such as a green sub-pixel region 102), and at least a third region (such as a blue sub-pixel region 103). Shadow walls surrounding the periphery of the at least three adjacent sub-pixels include L-shaped first portions 11A and 11B and linear second portions 11C. The L-shaped first portions 11A and 11B are disposed respectively on one side of the red sub-pixel region 101 and the blue sub-pixel region 103. The second portions 11C respectively disposed on another side of the red sub-pixel region 101 and the blue sub-pixel region 103 are corresponding to the short edges of the first portions 11A and 11B.

Referring to FIGS. 1A~1C, 2, and 3 at the same time, first, a substrate 10 is provided, and a first electrode 12 is formed on the substrate 10. Next, several shadow walls, such as L-shaped first portions 11A and 11B and linear second portions 11C, are formed around the first electrode 12. Also, at lease a first common layer 13 is formed on the first electrode 12. Then, referring to FIGS. 1A~1C (only RGB emission layers over the first electrode are illustrated), several first color emission layers (such as red sub-pixels), several second color emission layers (such as green sub-pixels) and several third color emission layers (such as blue sub-pixels) are formed on the first common layer 13.

The method for fabricating the color sub-pixels includes: providing at least a first color evaporation source, at least a second color evaporation source, and at least a third color evaporation source. Independent evaporation directions and evaporation angles of the first, the second, and the third evaporation sources cooperate with the shadow walls. As a result, at least a first color emission layer, at least a second color emission layer, and at least a third color emission layer are formed independently over the corresponding regions of the first electrode 12 with the corresponding color.

As shown in FIG. 1A, at lease a first color evaporation source (not shown in FIG. 1A), such as a red evaporation source, with a first evaporation direction 171 is provided. A first tilt angle θ1 is formed between the first evaporation direction 171 and the surface of the first common layer 13. The first evaporation direction 171 reaches the red sub-pixel region 101 to form the first color emission layer, such as the red emission layer 141. The height of the L-shaped first portion 11B of the shadow wall is corresponding to the first tilt angle θ1. The following blue emission layer and the green emission layer are to be formed in the regions 19 and 20 shown in FIG. 1A.

Next, as shown in FIG. 1B, at least a third evaporation source (not shown in FIG. 1B), such as a blue evaporation source, with a third evaporation 173 is provided. Also, a third tilt angle θ3 is formed between the third evaporation direction 173 and the surface of the first common layer 13. The third evaporation direction 173 reaches the blue sub-pixel region 103 to form the third emission layer, such as a blue emission layer 143. The height of the L-shaped first portion 11A of the shadow wall is corresponding to the third tilt angle θ3.

Afterward, as shown in FIG. 1C, at least a second color evaporation source (not shown in FIG. 1C), such as a green evaporation source, with a second evaporation direction 172 is provided. Also, a second tilt angle θ2 is formed between the second evaporation direction 172 and the surface of the first common layer 13. The second evaporation direction 172 reaches the green sub-pixel region 102 to form the second color emission layer, such as a green emission layer 142. As to the green sub-pixel region 102, the shadow walls are formed on two sides of the green sub-pixel region 102, so that the green emission layer 142 is formed. As to the blue sub-pixel region 103, the first portion 11B of the shadow wall prevents the green evaporation source from forming the green emission layer over the blue emission layer 143. Instead, the green emission layer 142 is formed on the portion near the second portion 11C of the shadow wall. Because this portion is a non-luminescent region, the blue emission layer 143 is not affected.

What is worth mentioning is that the positions of the shadow walls (including 11A, 11B and 11C) are corresponding to those of the first, the second and the third color evaporation sources. The heights of the shadow walls are corresponding to the first tilt angle θ1, the second tilt angle θ2 and the third tilt angle θ3 to define at least a first color sub-pixel region (such as the red sub-pixel region 101), at least a second color sub-pixel region (such as the green sub-pixel region 102), and at least a third color sub-pixel region (such as the blue sub-pixel region 103). The RGB evaporation regions could cover the corresponding portions of the first electrode. For example, the first tilt angle θ1, the second tilt angle θ2, and the third tilt angel θ3 range from about 20° to about 80°, and preferably, range from about 30° to about 70°. The heights of the shadow walls range from about 10 μm to about 500 μm, and preferably, range from about 20 μm to about 100 μm, depending on the pixel density of the panel. The preferable widths of the shadow walls range from about 30% to about 100% of the heights of the shadow walls.

Furthermore, when projecting on the substrate 10, the first evaporation angle 171 and the second evaporation angle 172 form a first angle θ12. When projecting on the substrate 10, the second evaporation angle 172 and the third evaporation angle 173 form a second angle θ23. When projecting on the substrate 10, the third evaporation angle 173 and the first evaporation angle 171 form a third angle θ31 (not shown). Moreover, the first angle θ12, the second angle θ23 and the third angle θ31 are substantially greater than or equal to about 90°.

After color emission layers are formed, at least a second common layer 15 is formed to cover the first color emission layers (such as the red emission layer 141), the second color emission layers (such as the green emission layer 142), and the third color emission layers (such as the blue emission layer 143). Thereon, a second electrode 16 is formed on the second common layer 15, as shown in FIG. 3.

As stated above, the shadow wall design of the present invention prevents the color emission layers in the sub-pixel regions from overlapping with each other. Also, the original RGB device structure is not changed by using this inventive process. Therefore, an organic electroluminescent panel is fabricated with no light mixture and high light purity. Also, due to the special design of the shadow walls, the first color emission layer (such as the red emission layer 141), the second color emission layer (such as the green emission layer 142), and the third emission layer (such as the blue emission layer 143) are formed orderly over the first common layer 13.

Practically, the shadow walls are disposed in the proper positions according to the structure and arrangement of the pixels in the organic electroluminescent panel. Five examples of the present invention are illustrated according to different pixel arrangement and shadow wall designs. However, the present invention is not limited to the examples. Additionally, some unnecessary components are neglected in the figures to clearly illustrate the examples of the present invention.

First Example

Figure 4:
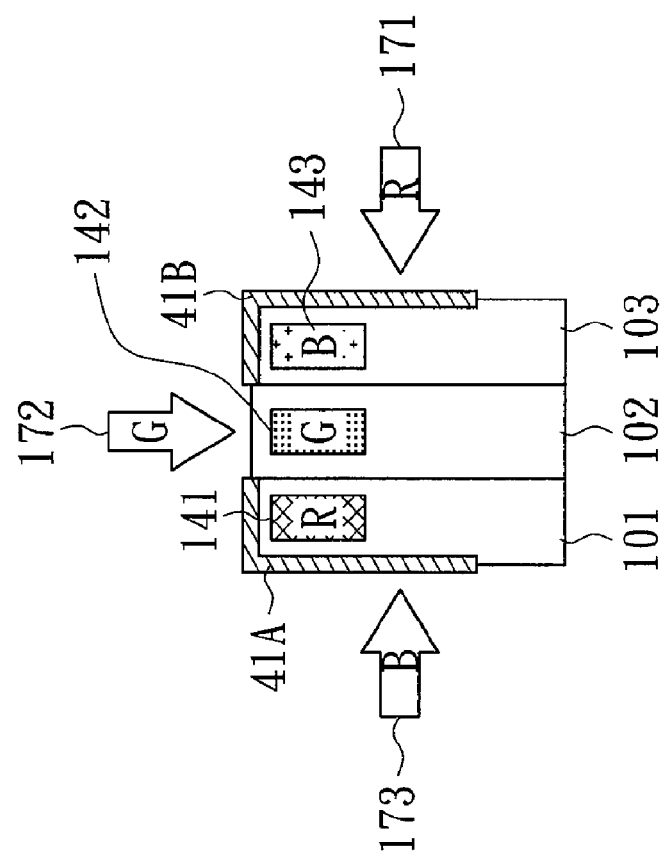
FIG. 4 illustrates a pixel structure and a shadow wall design according to an first example of the present invention.

FIG. 4 illustrates a pixel structure and a shadow wall design according to a first example of the present invention. In the present example of the invention, a pixel is made up of at least three adjacent sub-pixels including at least a first region (such as a red sub-pixel region 101), at least a second region (such as a green sub-pixel region 102), and at least a third region (such as a blue sub-pixel region 103). However, the number of the sub-pixels are non-limited it, for example, three or more adjacent sub-pixels, including four, five, six, etc. In additional, the color of each sub-pixel is not limited in red, green, blue, may be include other color, for example, white, brown, yellow, Cyan, Magenta, etc. The shadow walls include L-shaped portions 41A and 41B disposed respectively on one side of the red sub-pixel region 101 and the blue sub-pixel region 103. Next, the first color evaporation source (such as the red evaporation source), the second color evaporation source (such as the green evaporation source), and the third color evaporation source (such as the blue evaporation source) are provided.

The first tilt angle θ1 is formed between the first evaporation direction 171 of the first color evaporation source, (such as the red evaporation source) and the surface of the substrate. The second tilt angle 82 is formed between the second evaporation direction 172 of the second evaporation source (such as the green evaporation source) and the surface of the substrate. The third tilt angle θ3 is formed between the third evaporation direction 173 of the third evaporation source (such as the blue evaporation source) and the surface of the substrate (referring to the related description of the embodiment in FIGS. 1A~1C and FIG. 3).

The positions of the shadow walls 41A and 41B are corresponding to those of the first evaporation source (such as the red evaporation source), the second evaporation source (such as the green evaporation source), and the third evaporation source (such as the blue evaporation source). Also, the heights of the shadow walls 41A and 41B are corresponding to the first tilt angle θ1, the second tilt angle θ2, and the third tilt angle θ3. As a result, at least a first color sub-pixel region (such as the red sub-pixel region 101), at least a second color pixel region (such as the green sub-pixel region 102), and at least a third color pixel region (such as the blue sub-pixel region 103) are defined in each pixel region. The first evaporation direction 171, the second evaporation direction 172, and the third evaporation direction 173 respectively reach the first color sub-pixel region (such as the red sub-pixel region 101), the second color sub-pixel region (such as the green sub-pixel region 102), and the third color sub-pixel region (such as the blue sub-pixel region 103) in each pixel region. As a result, the first color emission layer (such as the red emission layer 141), the second color emission layer (such as the green emission layer 142), and the third color emission layer (such as the blue emission layer 143) are formed, respectively.

Figure 5A:
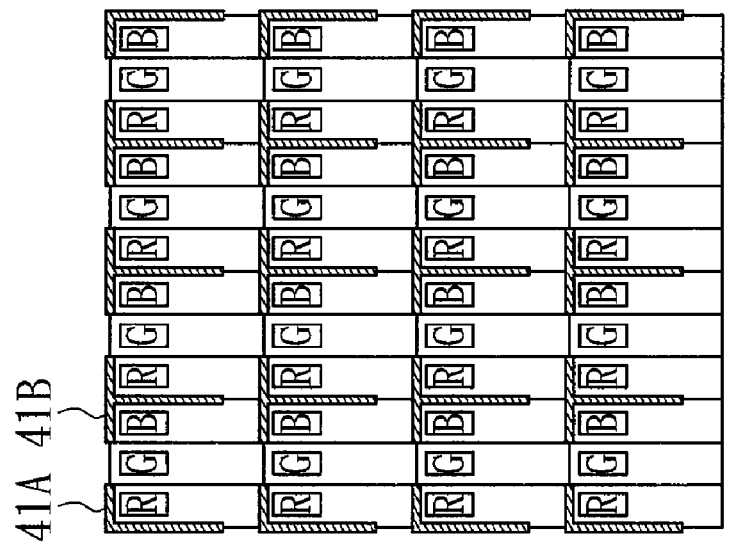
FIGS. 5A~5C respectively illustrate a first, a second and a third pixel arrangement and the shadow wall design of the full-color panel according to the first example of the present invention.
Figure 5C:
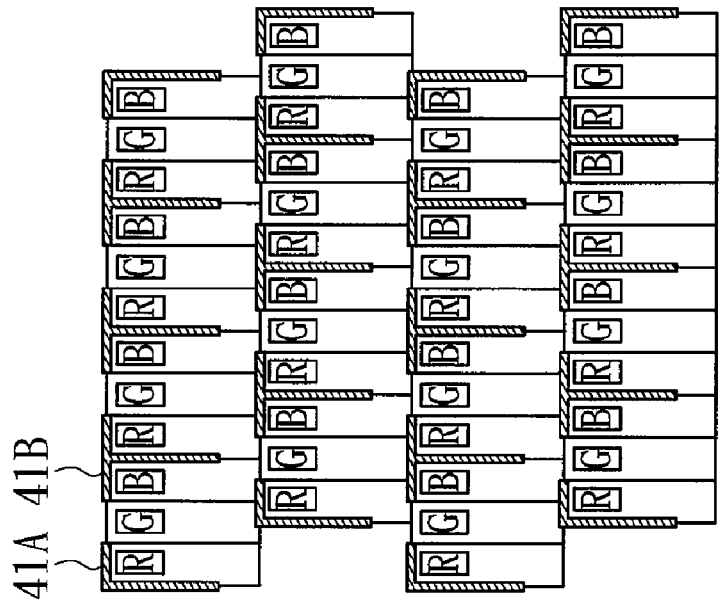
Figure 5B:
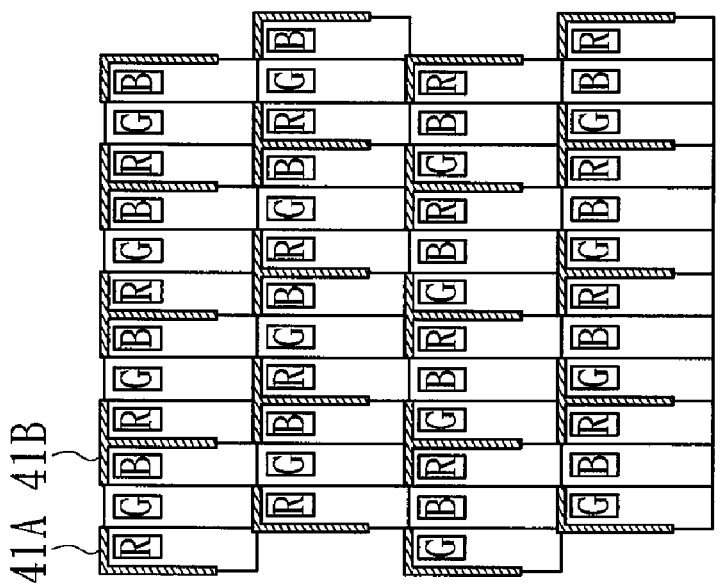

FIGS. 5A~5C respectively illustrate a first, a second, and a third pixel arrangement and the shadow wall designs of the full-color panel according to the first example of the present invention. The sub-pixels are respectively arranged in a stripe pattern, a mosaic pattern, and a delta (triangle) pattern in FIG. 5A~5C.

What is worth mentioning is that when the pixel structures and the shadow walls are arranged repeatedly to form the stripe pattern (as shown in FIG. 5A), the short edges of the L-shaped shadow walls 41A and 41B in FIG. 4 are equal to the linear second portions 11C in FIG. 2.

Through the pixel structure and the shadow wall design according to the first example of the present invention, each color emission layer is formed singly and independently in the sub-pixel region without changing the original fabricating method of RGB device structure by using this inventive process. Also, the color emission layers on the first electrode do not overlap with each other and have no light mixture.

Second Example

In a second example of the present invention, the positions of the shadow walls are determined according to two adjacent sub-pixels. Following examples 2A~2D are provided to reveal four applicable shadow wall designs.

Example 2A

Figure 6:
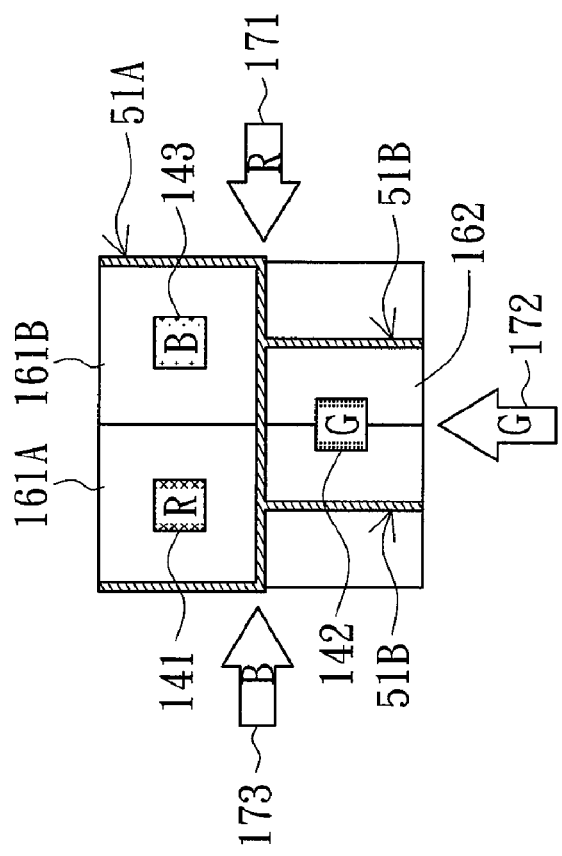
FIG. 6 illustrates a pixel structure and a shadow wall design according to an example 2A of the present invention.

FIG. 6 illustrates a pixel structure and a shadow wall design according to an example 2A of the present invention. Each pixel includes at least two first portions 161A and 161B and at least a second portion 162. The shadow walls include at least a first portion (U-shaped) 51A and at least two second portions (linear) 51B. The first portion 51A is disposed correspondingly on one side of the first regions 161A and 161B. The second portions 51B are disposed corresponding on two sides of the second region 162. Next, the first color evaporation source (such as the red evaporation source), the second color evaporation source (such as the green evaporation source), and the third color evaporation source (such as the blue evaporation source) are provided orderly.

Similarly, the first color evaporation source (such as the red evaporation source), the second color evaporation source (such as the green evaporation source), and the third color evaporation source (such as the blue evaporation source) are inclined to the surface of the substrate at proper tilt angles. As a result, the first color emission layer (such as the red emission layer 141) is formed in the first region 161A, the second color emission layer (such as the green emission layer 142) is formed in the second region 162, and the third color emission layer (such as the blue emission layer 143) is formed in the first region 161B.

Figure 7A:
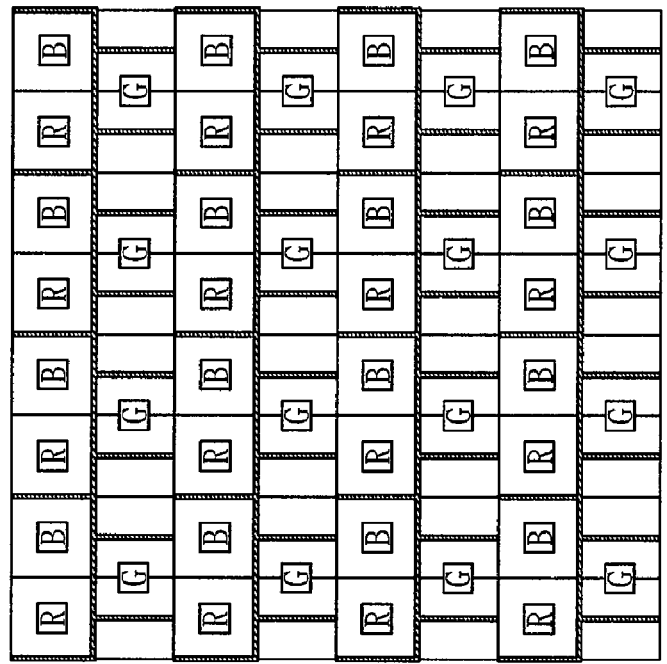
FIGS. 7A~7B illustrate two pixel arrangement and shadow wall designs of the full-color panel according to the example 2A of the present invention.
Figure 7B:
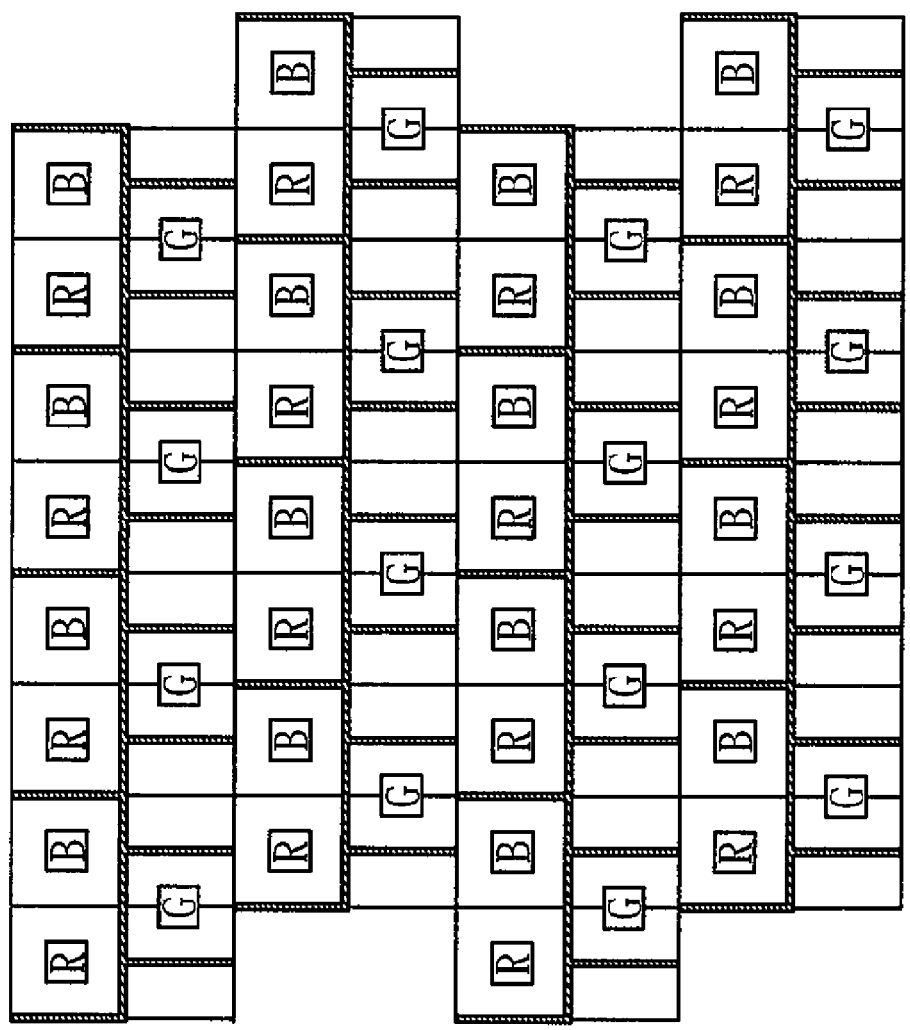

FIGS. 7A~7B illustrate two pixel arrangement and shadow wall designs of the full-color panel according to the example 2A of the present invention. According to the pixel structure and the shadow wall design of the example 2A, each color emission layer is formed singly and independently in the sub-pixel region without changing the original RGB device structure by using this inventive process. Also, the color emission layers on the first electrode do not cover with each other and have no light mixture.

Example 2B

Figure 8:
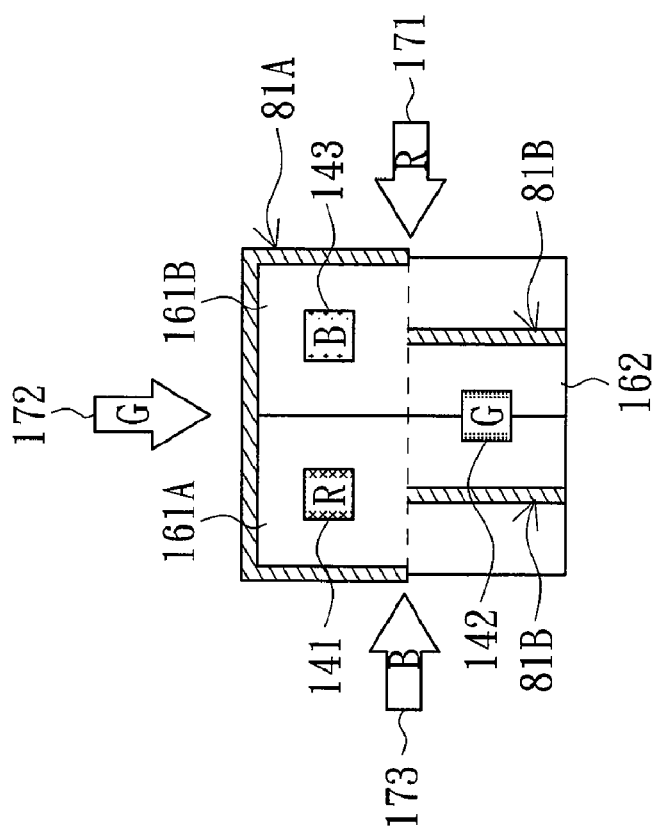
FIG. 8 illustrates a pixel structure and a shadow wall design according to an example 2B of the present invention.

FIG. 8 illustrates a pixel structure and a shadow wall design according to an example 2B of the present invention. Each pixel includes at least two first portions 161A and 161B and at least a second portion 162. The difference between the examples 2A and 2B is that: the shadow walls in example 2B include a U-shaped first portion 81A and two linear second portions 81B. The first portion 81A is disposed correspondingly on another side of the first portions 161A and 161B. The second portions 81B are disposed correspondingly on two sides of the second portion 162. Next, the first color evaporation source (such as the red evaporation source), the second color evaporation source (such as the green evaporation source), and the third color evaporation source (such as the blue evaporation source) are provided at the same time or orderly.

Similarly, the first evaporation direction 171 of the first color evaporation source (such as the red evaporation source), the second evaporation direction 172 of the second color evaporation source (such as the green evaporation source), and the third evaporation direction 173 of the third color evaporation source (such as the blue evaporation source) are inclined to the surface of the substrate at proper angles. As a result, the first color emission layer (such as the red emission layer 141) is formed in the first portion 161A, the second color emission layer (such as the green color emission layer 142) is formed in the second region 162, and the third emission layer (such as the blue emission layer 143) is formed in the first portion 161B. Moreover, the second evaporation directions in the examples 2A and 2B are different according to the positions of the shadow walls.

Figure 9A:
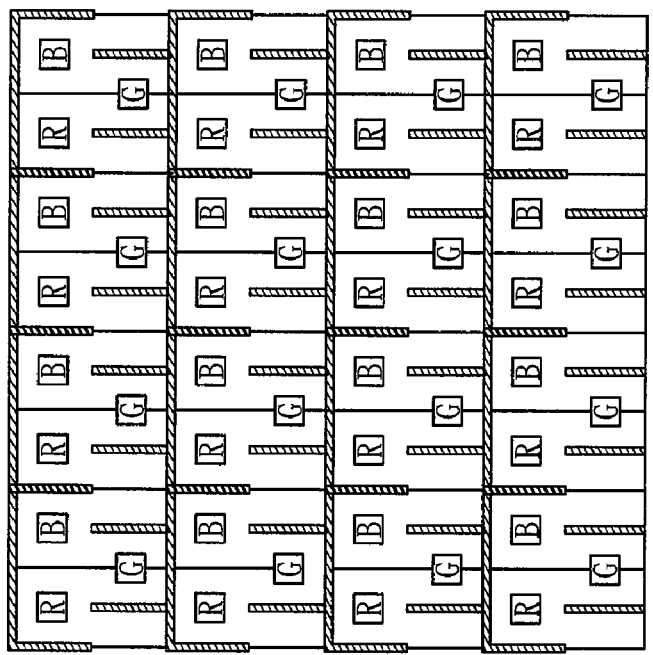
FIGS. 9A~9B illustrate two pixel arrangement and shadow wall designs of the full-color panel according the example 2B of the present invention.
Figure 9B:
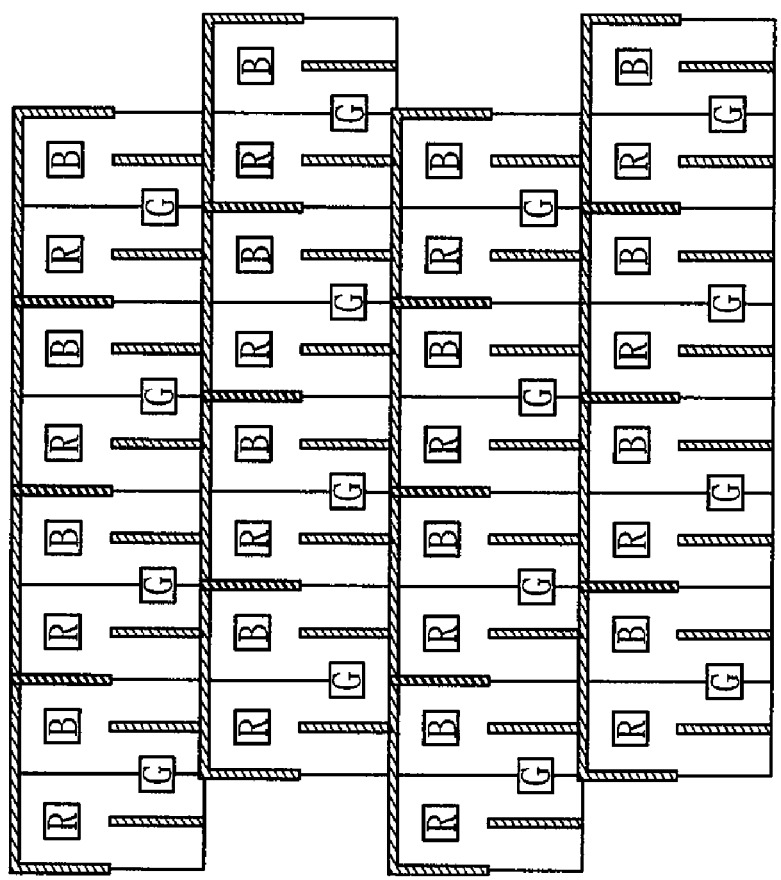

FIGS. 9A~9B illustrate two pixel arrangement and shadow wall designs of the full-color panel according the example 2B of the present invention. According to the pixel structure and shadow wall design in the example 2B, each color emission layer is formed singly and independently in the sub-pixel region without changing the original RGB device structure by using this inventive process. Also, the color emission layers on the first electrode do not cover each other and have no light mixture.

Example 2C

Figure 10:
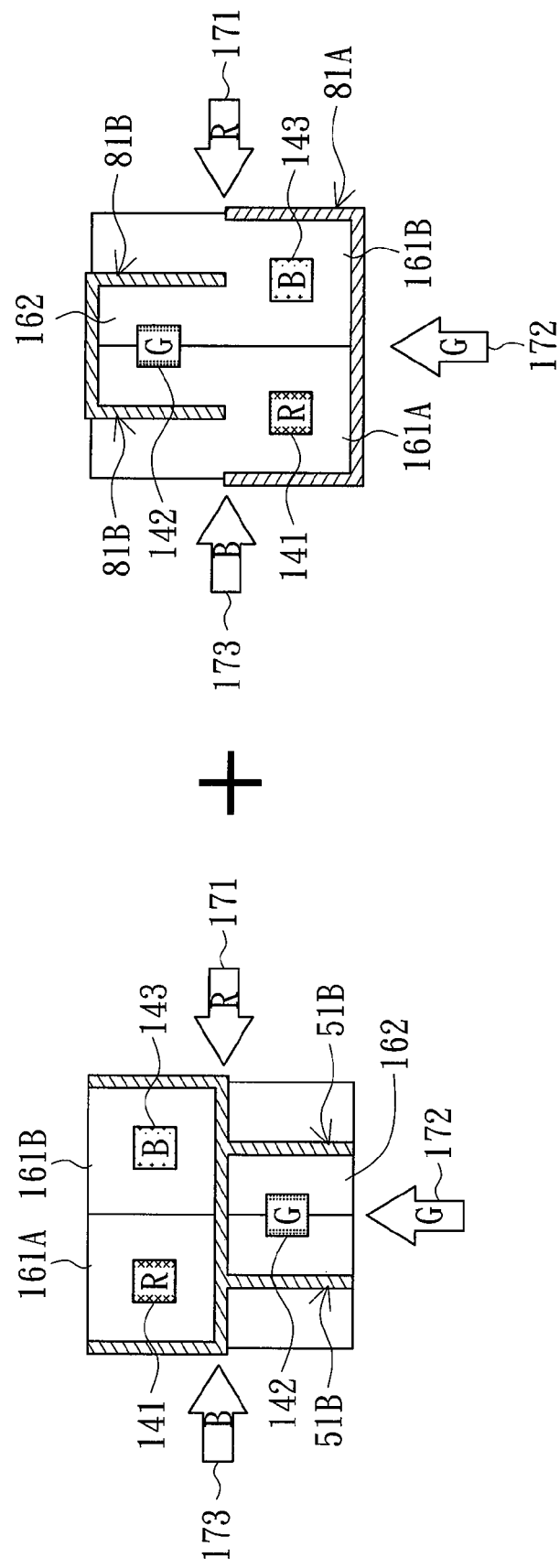
FIG. 10 illustrates a pixel structure and a shadow wall design according to an example 2C of the present invention.

FIG. 10 illustrates a pixel structure and a shadow wall design according to an example 2C of the present invention. In the example 2C, the pixel structures and shadow wall designs in the examples 2A and 2C are adopted. Therefore, the left portion of FIG. 10 is the same as FIG. 6, and the right portion of FIG. 10 is an upside-down figure of FIG. 8.

Figure 11:
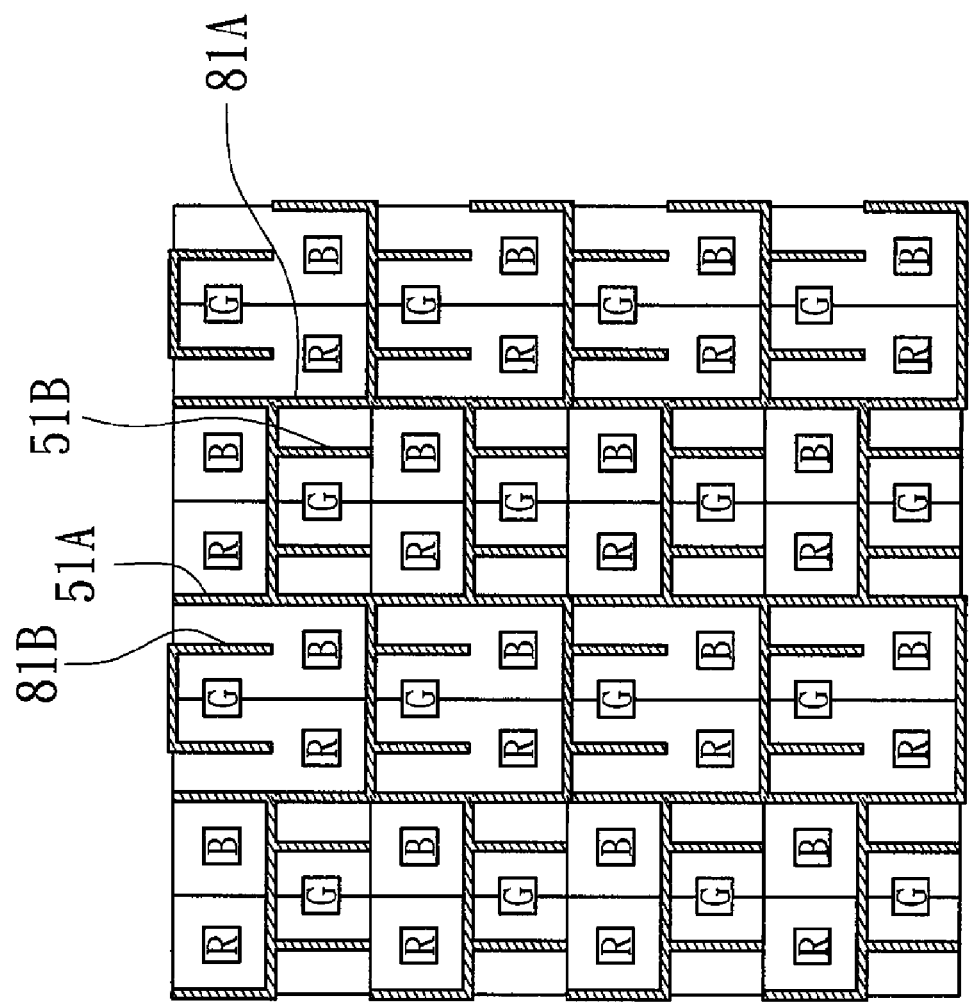
FIG. 11 illustrates pixel arrangement and a shadow wall design of the full-color panel according to the example 2C of the present invention.

FIG. 11 illustrates pixel arrangement and a shadow wall design of the full-color panel according to the example 2C of the present invention. The two figures in the FIG. 10 are arranged side by side to form one unit. The units are arranged repeatedly to form the pattern in FIG. 11.

According to the pixel structure and the shadow wall design in the example 2C, each color emission layer is formed singly and independently in the sub-pixel region without changing the original RGB device structure by using this inventive process. Also, the color emission layers on the first electrode do not overlap with each other and have no light mixture.

Example 2D

Figure 12:
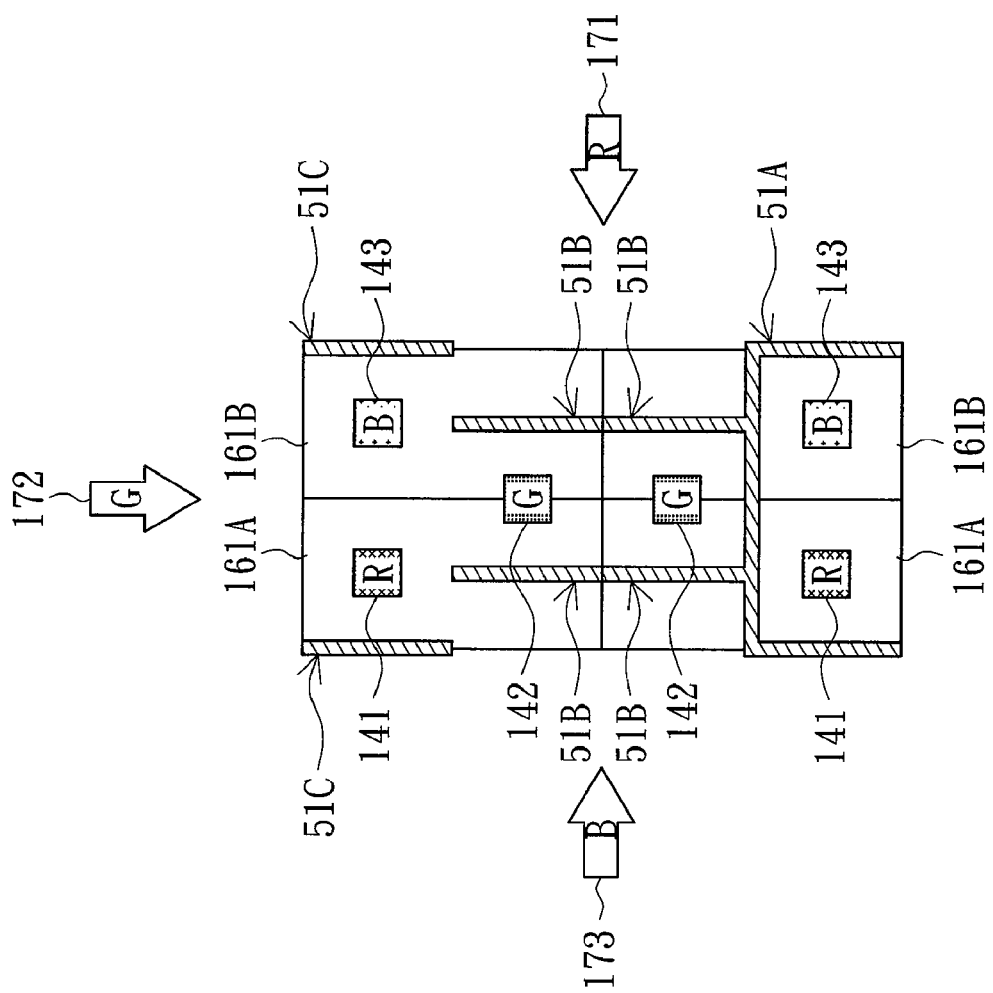
FIG. 12 illustrates the pixel structure and the shadow wall design according to an example 2D of the present invention.

FIG. 12 illustrates the pixel structure and the shadow wall design according to an example 2D of the present invention. Two pixels are illustrated in FIG. 12. The RGB emission regions of one pixel are almost horizontally symmetric to those of the other pixel. The pixel structure and the shadow wall design in the example 2D are modified from those in the example 2A. Therefore, the upper portion in FIG. 12 is modified from FIG. 6 (no connection between the shadow walls). The lower pattern in FIG. 12 is an upside-down figure of FIG. 6. Thus, the shadow walls in FIG. 12 include: a U-shaped first portion 51A, and two linear portions 51B and 51C. The first portion 51A is disposed correspondingly on one side of the first regions 161A and 161B. The second portion 51B is disposed correspondingly on two sides of the second region 162. The third portion 51C is disposed on another side of the first regions 161A and 161B. Also, the third portion 51C and the first portion 51A connect together after arranged repeatedly (as shown in FIG. 13).

Figure 13:
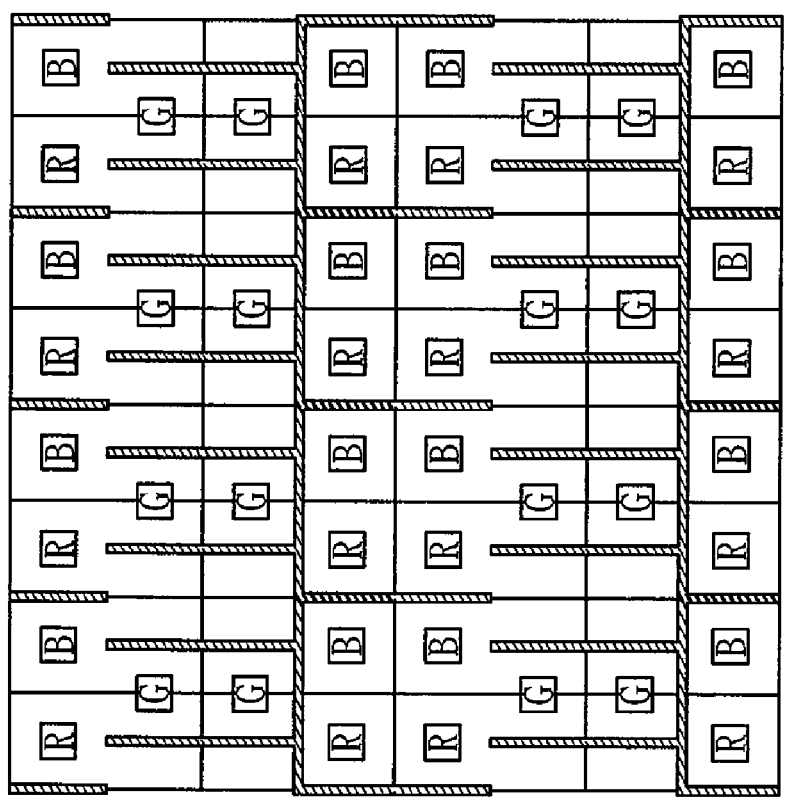
FIG. 13 illustrates pixel arrangement and a shadow wall design of a full-color panel according to the example 2D of the present invention.

FIG. 13 illustrates pixel arrangement and a shadow wall design of a full-color panel according to the example 2D of the present invention. The pixel structure and the shadow walls in FIG. 12 are arranged repeatedly to form the pattern in FIG. 13. According to the pixel structure and the shadow wall design of the example 2D, each color emission layer is formed singly and independently in the sub-pixel region without changing the original RGB device structure by using this inventive process. Also, the color emission layers on the first electrode do not overlap with each other and have no light mixture.

Third Example

Figures 14A, 14B:
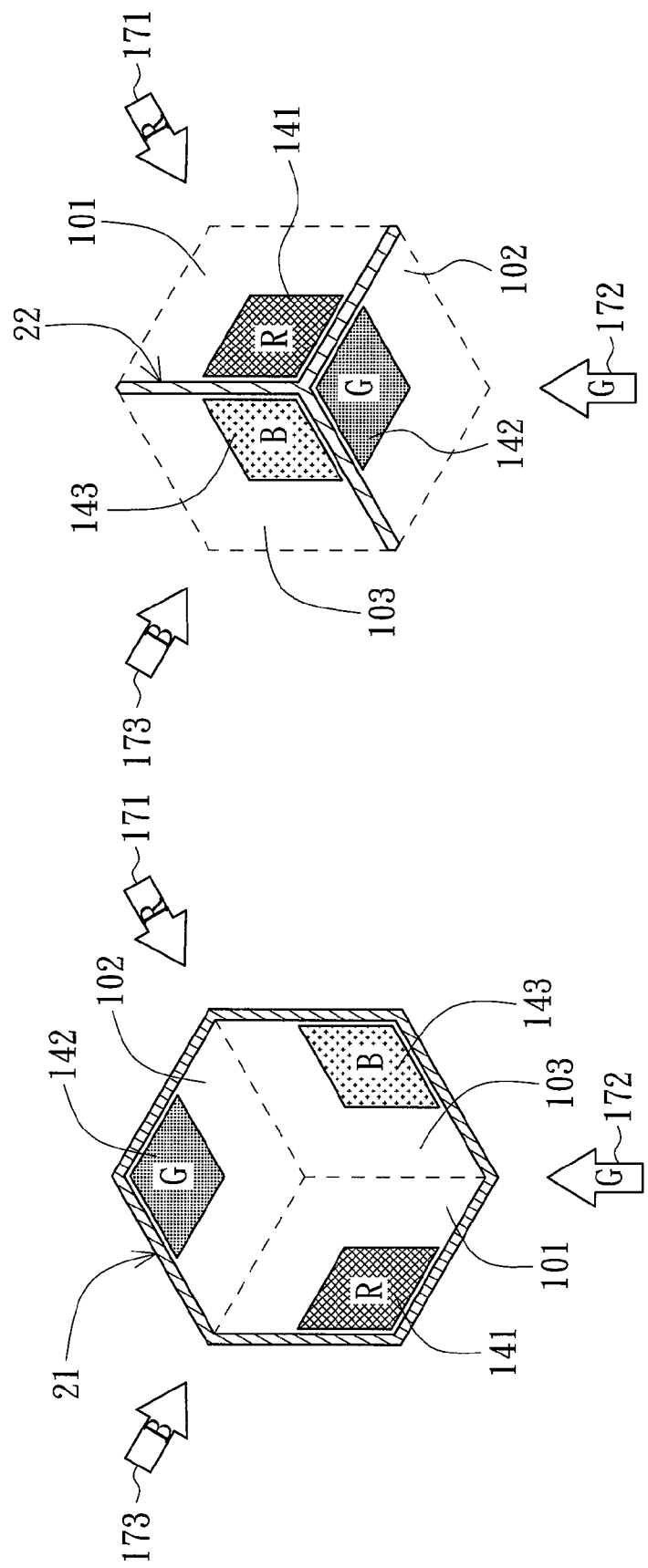
FIGS. 14A~14B illustrate two pixel structures and shadow wall designs according to a third embodiment of the present invention.

FIGS. 14A~14B illustrate two pixel structures and shadow wall designs according to a third example of the present invention. In the present example, one pixel is made up of at least three adjacent sub-pixels, but non-limited it, for example, three or more adjacent sub-pixels, including four, five, six, etc. In additional, the color of each sub-pixel is not limited in red, green, blue, may be include other color, for example, white, brown, yellow, Cyan, Magenta, etc. The pixel includes the first region (such as the red sub-pixel region 101), the second region (such as the green sub-pixel region 102), and the third region (such as the blue sub-pixel region 103).

In FIG. 14A, the shadow wall 21 surrounds the periphery of the at least three adjacent sub-pixels. In FIG. 14B, shadow walls 22 are disposed between any two of the at least three adjacent sub-pixels. Next, the first color evaporation source (such as the red evaporation source), the second color evaporation source (such as the green evaporation source), and the third evaporation source (such as the blue evaporation source) are provided.

Similarly, the first evaporation direction 171 of the first color evaporation source (such as the red evaporation source), the second evaporation direction 172 of the second color evaporation source (such as the green evaporation source), and the third direction 173 of the third color evaporation source (such as the blue evaporation source) are inclined to the surface of the substrate at proper tilt angles. As a result, the first color emission layer (such as the red emission layer 141), the second color emission layer (such as the green emission layer 142), and the third color emission layer (such as the blue emission layer 143) are formed respectively in the first region (such as the red sub-pixel region 101), the second region (such as the green sub-pixel region 102), and the third region (such as the blue sub-pixel region 103).

Figure 15B:
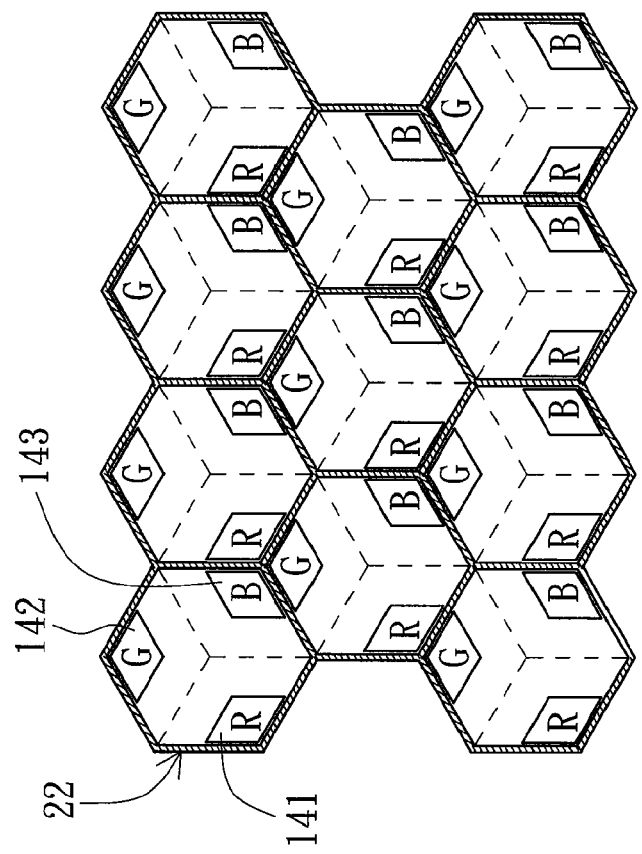
FIGS. 15A~15B illustrate pixel arrangement and a shadow wall design of a full-color panel according to the third example of the present invention.
Figure 15A:
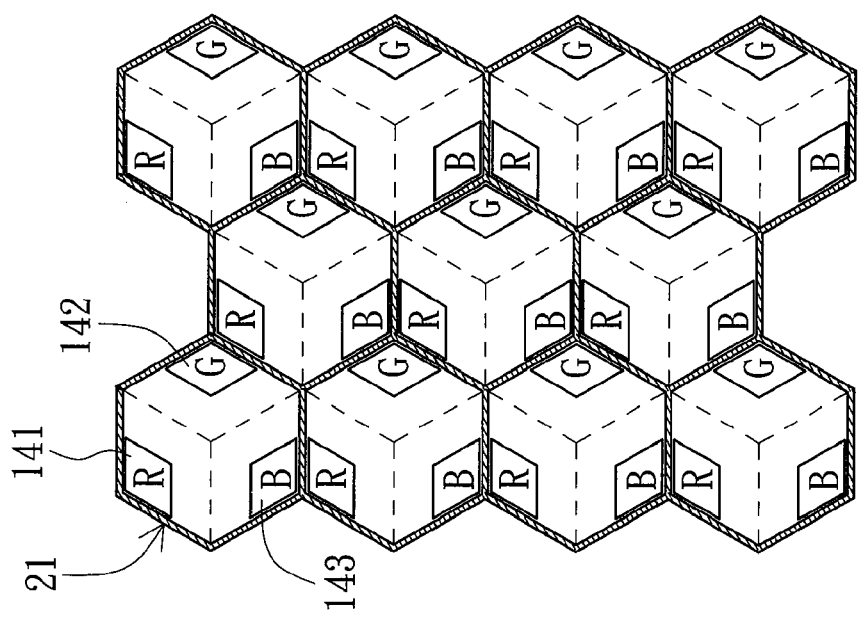

FIGS. 15A~15B illustrate pixel arrangement and a shadow wall design of a full-color panel according to the third example of the present invention. According to the pixel structure and the shadow wall design in the third example, each color emission layer is formed singly and independently in the sub-pixel region without changing the original RGB device structure by using this inventive process. Also, the color emission layers on the first electrode do not overlap with each other and have no light mixture.

Fourth Example

Figure 16:
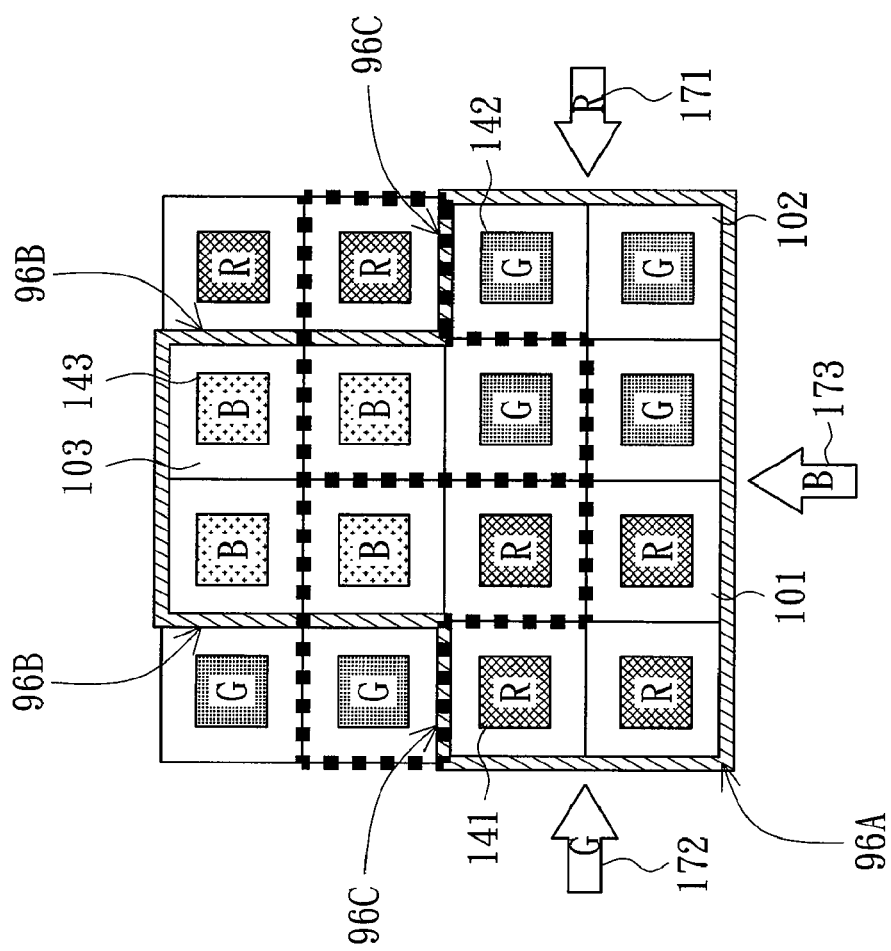
FIG. 16 illustrates a pixel structure and a shadow wall design according to a fourth example of the present invention.

FIG. 16 illustrates a pixel structure and a shadow wall design according to a fourth example of the present invention. A dotted portion represents one pixel. One sub-pixel region is made up of four emission layers with the same color. Sub-pixel regions include the first region (such as the red sub-pixel region 101), the second region (such as the green sub-pixel region 102), and the third region (such as the blue sub-pixel region 103). The shadow walls in the fourth example include a first portion (U-shaped) 96A, a second portion (linear) 98B and a third portion 96C. The first portion 96A is disposed correspondingly on one side of the red sub-pixel region 101 and the green sub-pixel region 102. The second portion 96B is disposed correspondingly on two sides of the blue sub-pixel region 103. The third portion 96C is disposed on another side of the red sub-pixel region 101 and the green sub-pixel region 102. The third portion 96C connects the first portion 96A and the second portion 96B. Then, the first color evaporation source (such as the red evaporation source), the second color evaporation source (such as the green evaporation source), and the third color evaporation source (such as the blue evaporation source) are provided.

Similarly, the first evaporation direction 171 of the first color evaporation source (such as the red evaporation source), the second evaporation direction 172 of the second color evaporation source (such as the green evaporation source), and the third direction 173 of the third color evaporation source (such as the blue evaporation source) are inclined to the surface of the substrate at proper tilt angles. As a result, the first color emission layer (such as the red emission layer 141), the second color emission layer (such as the green emission layer 142), and the third color emission layer (such as the blue emission layer 143) are formed respectively in the first region (such as the red sub-pixel region 101), the second region (such as the green sub-pixel region 102), and the third region (such as the blue sub-pixel region 103).

Figure 17:
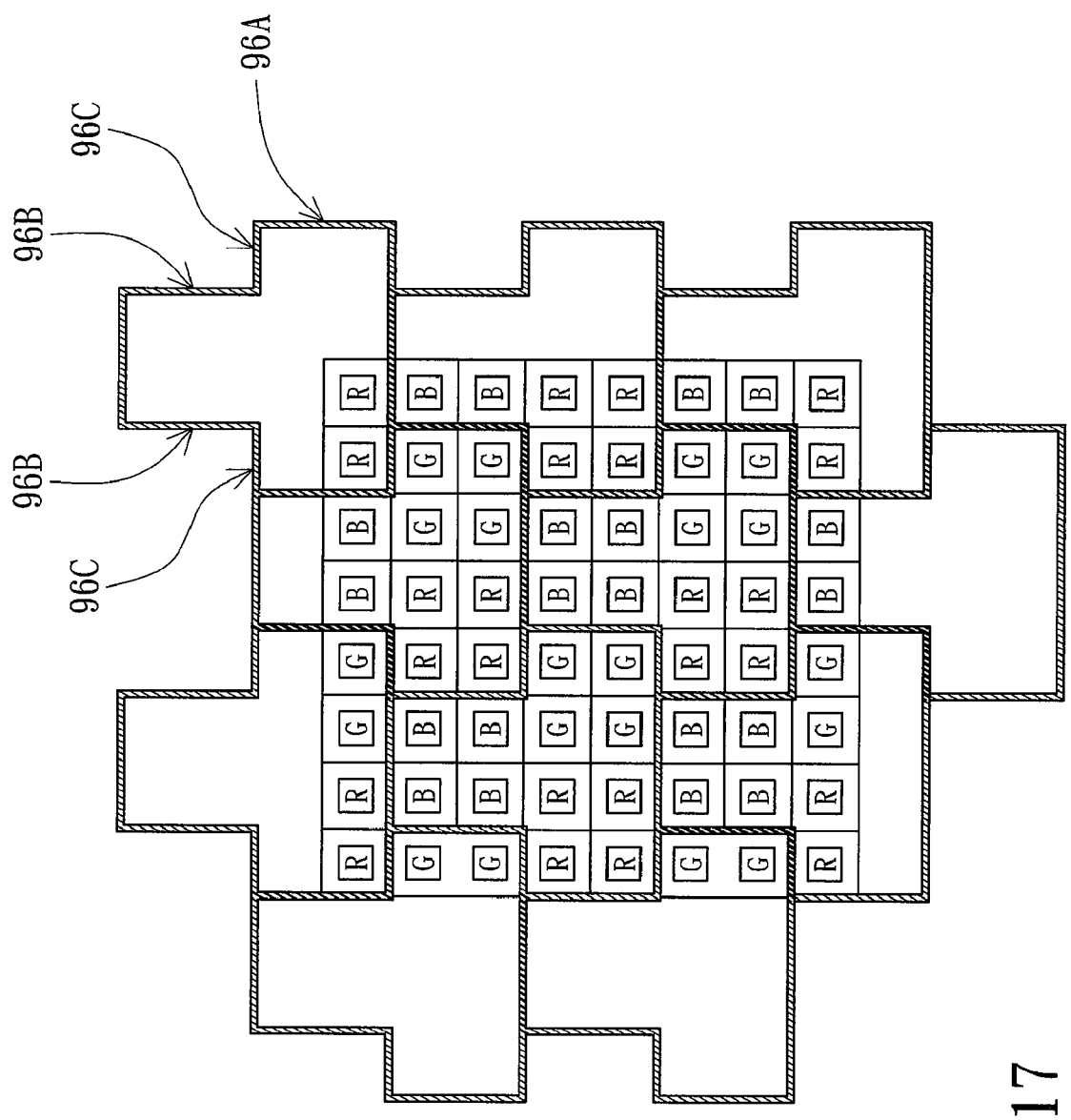
FIG. 17 illustrates pixel arrangement and a shadow wall design of a full-color panel according to the fourth example of the present invention.

FIG. 17 illustrates pixel arrangement and a shadow wall design of a full-color panel according to the fourth example of the present invention. According to the pixel structure and the shadow wall design in the fourth example, each color emission layer is formed singly and independently in the sub-pixel region without changing the original RGB device structure by using this inventive process. Also, the color emission layers on the first electrode do not overlap with each other and have no light mixture.

Fifth Example

Figure 18:
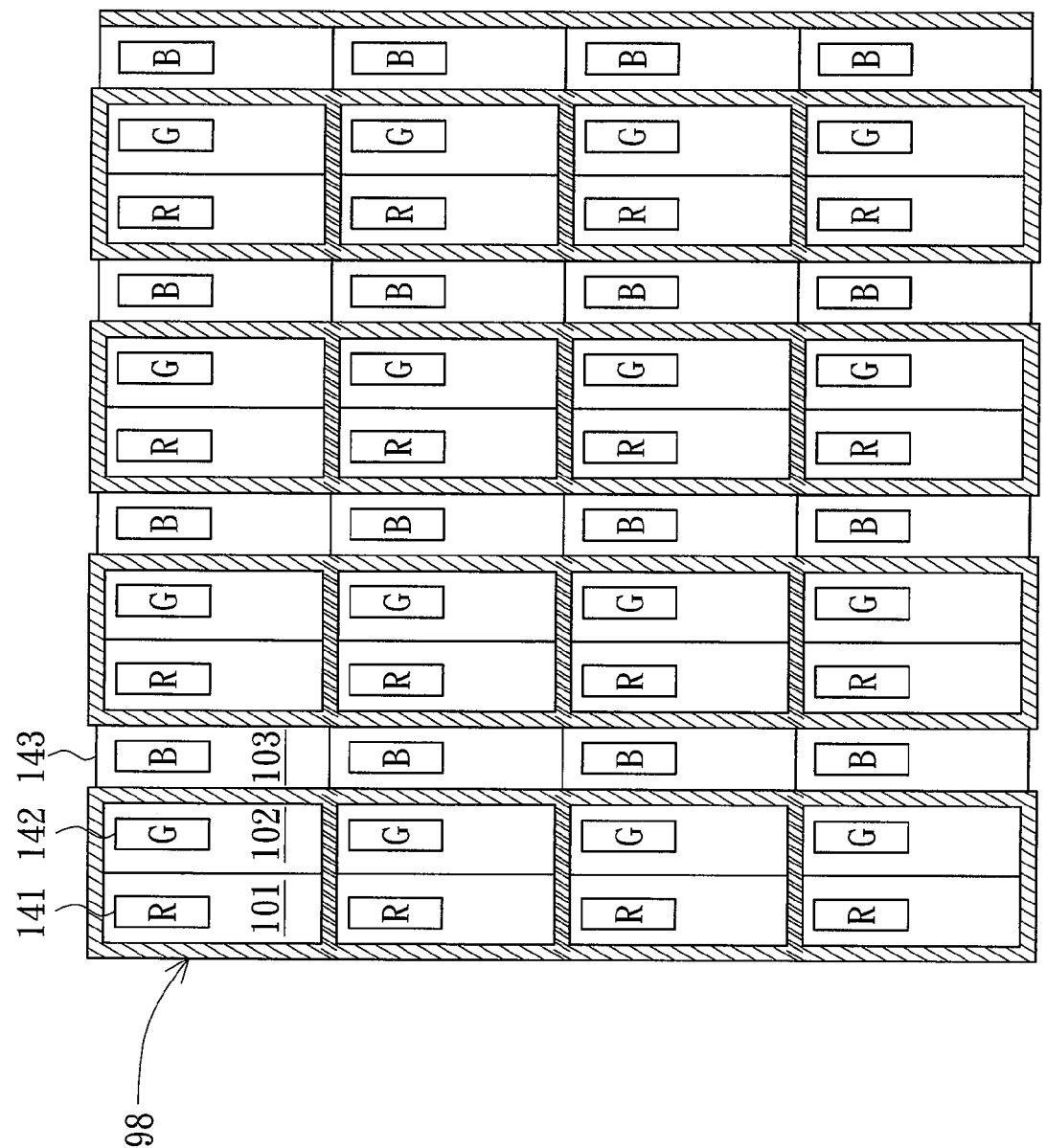
FIG. 18 illustrates pixel arrangement and a shadow wall design of a full-color panel according to a fifth example of the present invention.

FIG. 18 illustrates pixel arrangement and a shadow wall design of a full-color panel according to a fifth example of the present invention. In the present example, one pixel is made up of at least three adjacent sub-pixel regions including the first region (such as the red sub-pixel region 101), the second region (such as the green sub-pixel region 102), and the third region (such as the blue sub-pixel region 103). However, the number of the sub-pixels are non-limited it, for example, three or more adjacent sub-pixels, including four, five, six, etc. In additional, the color of each sub-pixel is not limited in red, green, blue, may be include other color, for example, white, brown, yellow, Cyan, Magenta, etc. The shadow wall 98 surrounds the periphery of two sub-pixels among the at least three adjacent sub-pixels. As shown in FIG. 18, the shadow wall 98 surrounds the red sub-pixel region 101 and the green sub-pixel region 102. Then, the first color evaporation source (such as the red evaporation source), the second color evaporation source (such as the green evaporation source), and the third color evaporation source (such as the blue evaporation source) are provided. As a result, the first color emission layer (such as the red emission layer 141), the second color emission layer (such as the green emission layer 142), and the third color emission layer (such as the blue emission layer 143) are formed respectively.

According to the pixel structure and the shadow wall design in the fifth example of the present invention, each color emission layer is formed singly and independently in the sub-pixel region without changing the original RGB device structure by using this inventive process. Also, the color emission layers on the first electrode do not overlap with each other and have no light mixture.

The above-description is a detailed illustration for a variety of preferred embodiments of the present invention. The embodiments should not be construed as limiting the scope of the invention. Rather, it is intended to cover various modifications and similar arrangements included within the spirit and scope of the appended claims, the scope of which should be accorded the broadest interpretation so as to encompass all such modifications and similar structure.

What is claimed is:

1. A pixel structure of an organic electroluminescent panel, the pixel structure comprising: a plurality of sub-pixels having at least one first electrode;
   at least one shadow wall formed at the periphery of the first electrode;
   at least one first common layer formed on the first electrode;
   a plurality of emission layers, each emission layer being formed on the first common layer of a corresponding sub-pixel, wherein each emission layer is non-overlapped with each other, each emission layer does not emit mixing color light;
   at least one second common layer formed on the emission layers; and
   at least one second electrode formed on the second common layer; wherein every three adjacent sub-pixels of the sub-pixels form a pixel, and the shadow wall surrounds the respective sides of the two adjacent sub-pixels and is not disposed between the two adjacent sub-pixels surrounded by the shadow wall.

2. The pixel structure of claim 1, wherein the height of the shadow wall ranges from about 10 μm to about 500 μm.

3. The pixel structure of claim 2, wherein the width of the shadow wall ranges from about 30% to about 100% of the height of the shadow wall.

4. A method for fabricating an organic electroluminescent panel having a substrate, comprising:
   forming a first electrode on the substrate;
   forming a plurality of shadow walls on the periphery of the first electrode;
   forming at least a first common layer on the first electrode; and
   forming a plurality of first color emission layers, a plurality of second color emission layers, and a plurality of third color emission layers on the first common layer, comprising:
   providing at least one first color evaporation source, at least one second color evaporation source, and at least one third color evaporation source, wherein an independent evaporation directions and an evaporation angles of the first color evaporation source, the second color evaporation source, and the third color evaporation source cooperate with the shadow walls, so that at least one first color emission layer, at least one second color emission layer and at least one third color emission layer are respectively formed on the corresponding regions of the first electrode with the corresponding color;
   forming at least one second common layer to cover the first color emission layers, the second color emission layers, and the third color emission layers; and
   forming a second electrode on the second common layer.

5. The method of claim 4, wherein the first evaporation direction of the first evaporation source, the second evaporation direction of the second evaporation source, and the third evaporation direction of the third evaporation source are inclined to the surface of the substrate at a first tilt angle, a second tilt angle, and a third tilt angle, respectively.

6. The method of claim 5, wherein the first tilt angle, the second tilt angle, and the third tilt angle range from about 20° to about 80°.

7. The method of claim 5, wherein the first tilt angle, the second tilt angle, and the third tilt angle range from about 30° to about 70°.

8. The method of claim 4, wherein a first angle, a second angle, and a third angle are formed between each two directions among the first, the second, and the third evaporation directions, wherein the first angle, the second angle, and the third angle are greater than or equal to about 90°.

9. The method of claim 4, wherein the heights of the shadow walls range from about 10 μm to about 500 μm.

10. The method of claim 4, wherein the widths of the shadow walls range from about 30% to about 100% of the heights of the shadow walls.

11. A pixel structure of an organic electroluminescent panel, the pixel structure comprising: a plurality of sub-pixels having at least one first electrode;
    at least one shadow wall formed at the periphery of the first electrode;
    at least one first common layer formed on the first electrode;
    a plurality of emission layers, each emission layer being formed on the first common layer of a corresponding sub-pixel, wherein each emission layer is non-overlapped with each other, each emission layer does not emit mixing color light;
    at least one second common layer formed on the emission layers; and
    at least one second electrode formed on the second common layer;
    wherein every three adjacent sub-pixels of the sub-pixels form a pixel including at least two adjacent first regions and at least one second region;
    the shadow wall comprises at least one first portion and at least two second portions, the first portion is physically disposed correspondingly on one side of the first regions, and the second portions are physically disposed correspondingly on two sides of the second region, and the shadow wall is not disposed between the two adjacent first regions.

12. The pixel structure of claim 11, wherein the shadow wall comprises at least one third portion disposed on another side of the first regions and connected to the first portion.

13. The pixel structure of claim 11, wherein the shadow wall comprises at least one third portion disposed on another side of the first regions and connected to the first portion and the second portions.

14. The pixel structure of claim 11, wherein the height of the shadow wall ranges from about 10 μm to about 500 μm.

15. The pixel structure of claim 11, wherein the width of the shadow wall ranges from about 30% to about 100% of the height of the shadow wall.

16. A pixel structure of an organic electroluminescent panel, the pixel structure comprising: a plurality of sub-pixels having
at least one first electrode;
at least one shadow wall formed at the periphery of the first electrode;
at least one first common layer formed on the first electrode;
a plurality of emission layers, each emission layer being formed on the first common layer of a corresponding sub-pixel, wherein each emission layer is non-overlapped with each other, each emission layer does not emit mixing color light;
at least one second common layer formed on the emission layers; and
at least one second electrode formed on the second common layer;
wherein every three adjacent sub-pixels of the sub-pixels form a pixel;
the shadow wall surrounds the periphery of the three adjacent sub-pixels but the shadow wall is not disposed between any two of the three adjacent sub-pixels; or
the shadow wall is disposed between any two of the three adjacent sub-pixels but the shadow wall does not surround the periphery of the three adjacent sub-pixels.

17. A pixel structure of an organic electroluminescent panel, the pixel structure comprising: a plurality of sub-pixels having at least one first electrode;
at least one shadow wall formed at the periphery of the first electrode;
at least one first common layer formed on the first electrode;
a plurality of emission layers, each emission layer being formed on the first common layer of a corresponding sub-pixel, wherein each emission layer is non-overlapped with each other, each emission layer does not emit mixing color light;
at least one second common layer formed on the emission layers; and
at least one second electrode formed on the second common layer;
wherein every three adjacent sub-pixels form a pixel including at least one first region, at least one second region, and at least one third region; and
the shadow wall comprises at least two L-shaped first portions, the L-shaped first portions are physically disposed on one side of the first region and the third region, respectively.

18. The pixel structure of claim 17, wherein the shadow wall further comprises at least two second portions, the second portions are physically disposed on another side of the first region and the third region, respectively, and the second portions correspond to the short edges of the L-shaped first portions.

19. A pixel structure of an organic electroluminescent panel, the pixel structure comprising: a plurality of sub-pixels having at least one first electrode;
at least one shadow wall formed at the periphery of the first electrode;
at least one first common layer formed on the first electrode;
a plurality of emission layers, each emission layer being formed on the first common layer of a corresponding sub-pixel, wherein each emission layer is non-overlapped with each other, each emission layer does not emit mixing color light;
at least one second common layer formed on the emission layers; and
at least one second electrode formed on the second common layer;
wherein every three sub-pixels form a pixel;
the shadow wall only surrounds the periphery of any two non-adjacent sub-pixels of the three sub-pixels, and the shadow wall surrounds the respective sides of any two non-adjacent sub-pixels of the three sub-pixels.

20. A pixel structure of an organic electroluminescent panel, the pixel structure comprising: a plurality of sub-pixels having at least one first electrode;
at least one shadow wall formed at the periphery of the first electrode;
at least one first common layer formed on the first electrode;
a plurality of emission layers, each emission layer being formed on the first common layer of a corresponding sub-pixel, wherein each emission layer is non-overlapped with each other, each emission layer does not emit mixing color light;
at least one second common layer formed on the emission layers; and
at least one second electrode formed on the second common layer;
wherein every three adjacent sub-pixels of the sub-pixels form a pixel including at least one first region, at least one second region and at least one third region;
the shadow wall includes at least a first portion, at least a second portion and at least a third portion, the first portion is physically disposed correspondingly on one side of the first region and the second region, the second portion is physically disposed correspondingly on two sides of the third region, the third portion is physically disposed on another side of the first region and the second region, and the third portion connects the first portion and the second portion.

21. The pixel structure of claim 19, wherein the shadow wall surrounds the respective two sides or the respective three sides of any two non-adjacent sub-pixels of the three sub-pixels.

* * * * *